United States Patent [19]

Schweitzer, Jr.

[11] Patent Number: 5,180,972
[45] Date of Patent: Jan. 19, 1993

[54] HOUSING INCLUDING BIASING SPRINGS EXTENDING BETWEEN CLAMP ARMS FOR CABLE MOUNTED POWER LINE MONITORING DEVICE

[76] Inventor: Edmund O. Schweitzer, Jr., 2433 Center St., Northbrook, Ill. 60062

[21] Appl. No.: 828,428

[22] Filed: Jan. 31, 1992

[51] Int. Cl.⁵ .................. G01R 31/02; G01R 19/165; G01R 1/04
[52] U.S. Cl. .............................. 324/127; 324/133; 336/176; 340/664
[58] Field of Search ............... 324/127, 133; 336/175, 336/176; 340/664

[56] References Cited

U.S. PATENT DOCUMENTS

| | | | |
|---|---|---|---|
| 4,456,873 | 6/1984 | Schweitzer, Jr. | 324/51 |
| 4,495,489 | 1/1985 | Schweitzer, Jr. | 340/664 |
| 4,646,006 | 2/1987 | Schweitzer, Jr. | 324/127 |
| 4,686,518 | 8/1987 | Schweitzer, Jr. | 340/664 |
| 4,794,329 | 12/1988 | Schweitzer, Jr. | 324/127 |
| 4,794,332 | 12/1988 | Schweitzer, Jr. | 324/133 |
| 4,795,982 | 1/1989 | Schweitzer, Jr. | 324/508 |
| 4,998,060 | 3/1991 | Yeh | 324/127 |

*Primary Examiner*—Gerard R. Strecker
*Attorney, Agent, or Firm*—Lockwood, Alex, FitzGibbon & Cummings

[57] ABSTRACT

A housing and clamp assembly for mounting a circuit condition monitoring device on a monitored electrical cable includes a body member for housing device circuitry, a first relatively non-resilient clamp arm, and a second relatively resilient clamp arm. The clamp arms are biased closed around the conductor without pre-configuration of the clamp arms by parallel-spaced helical springs, which also serve to hold the cable against an indexing surface on the first clamp arm to minimize the effect of cable diameter on the spacing between the cable and the condition monitoring device and hence the calibration of the monitoring device.

14 Claims, 3 Drawing Sheets

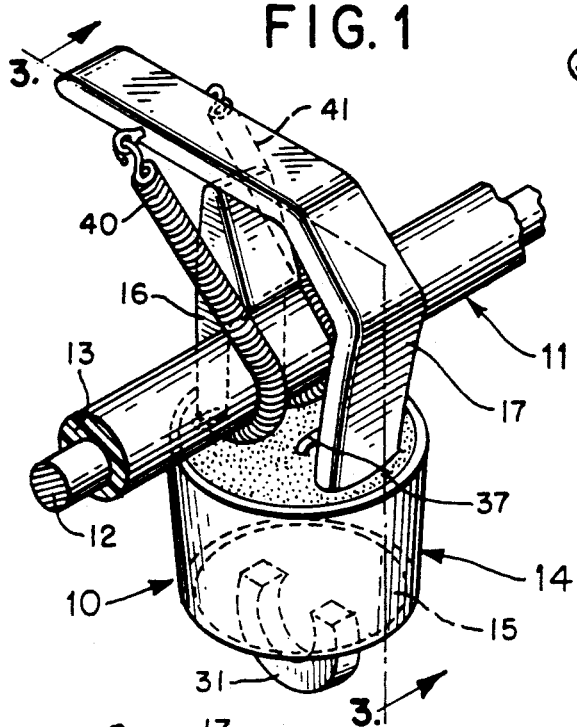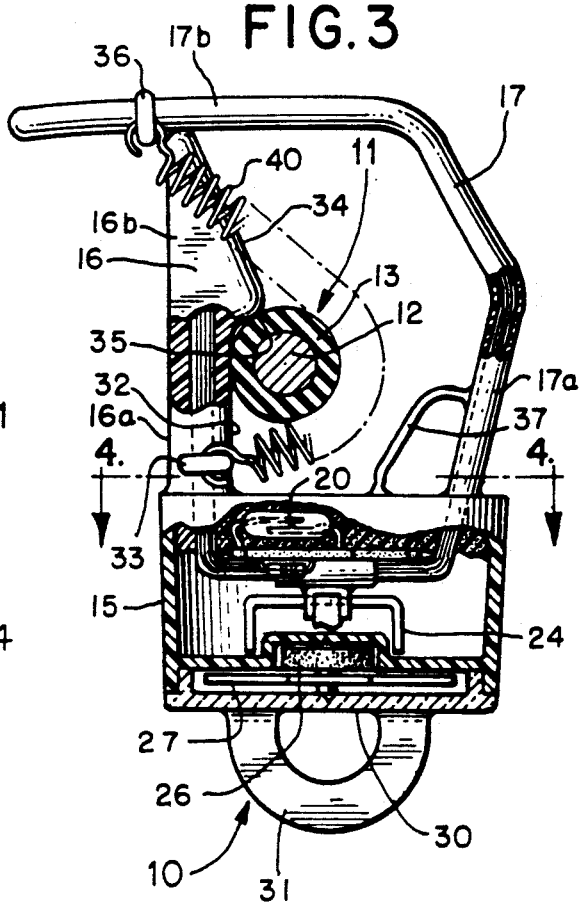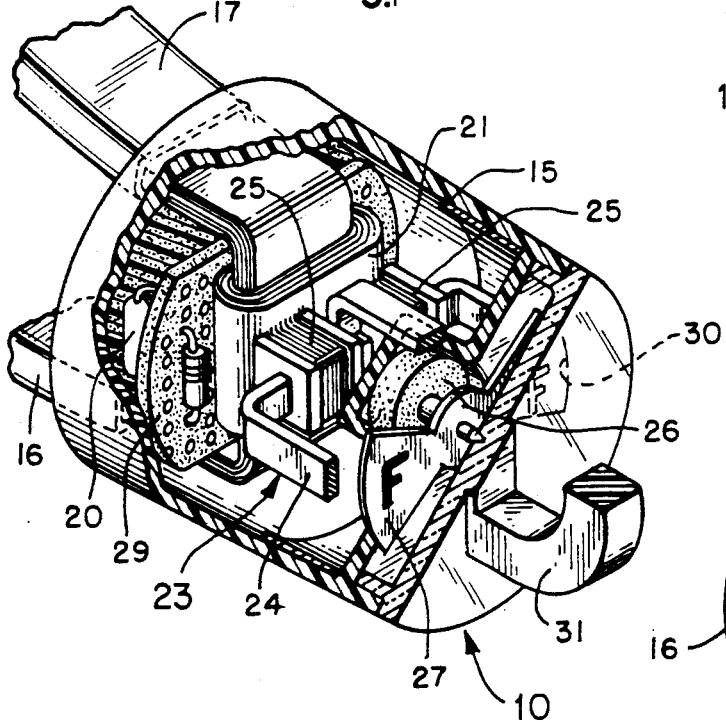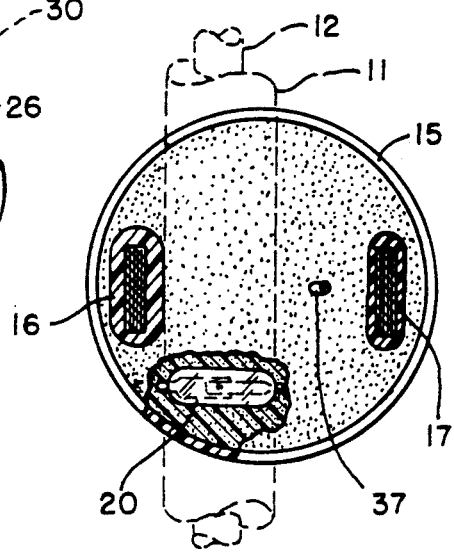

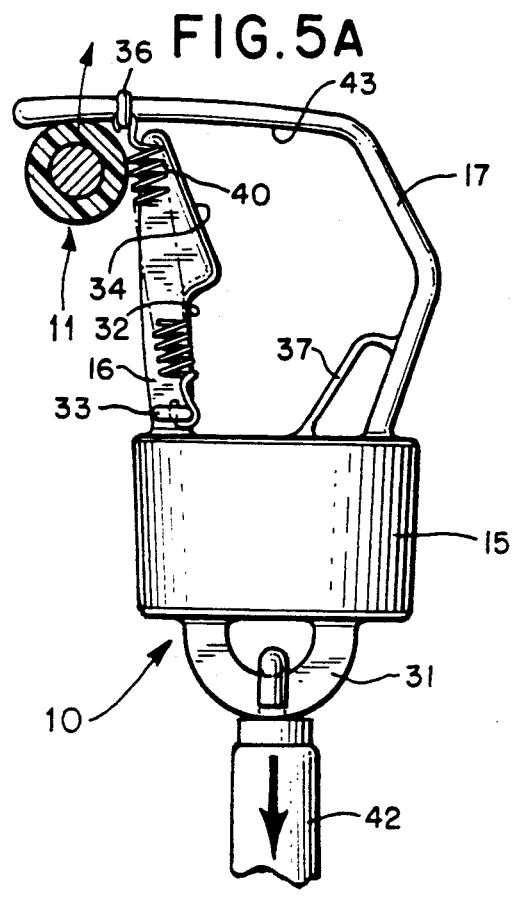
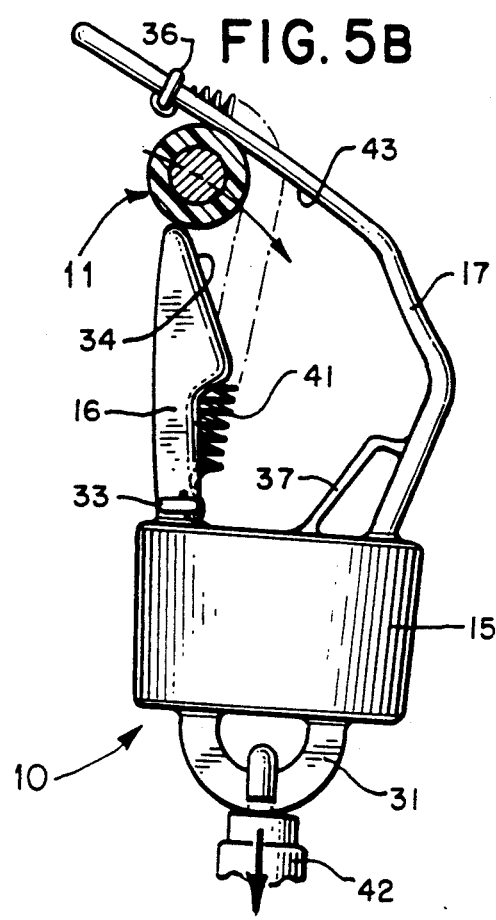
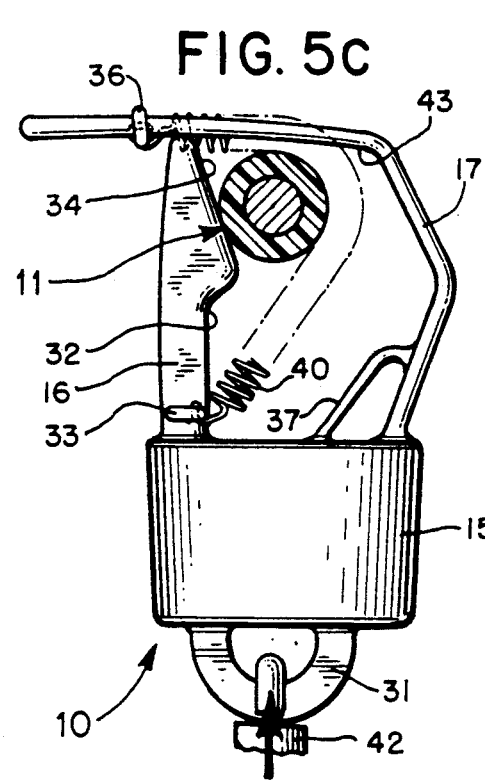
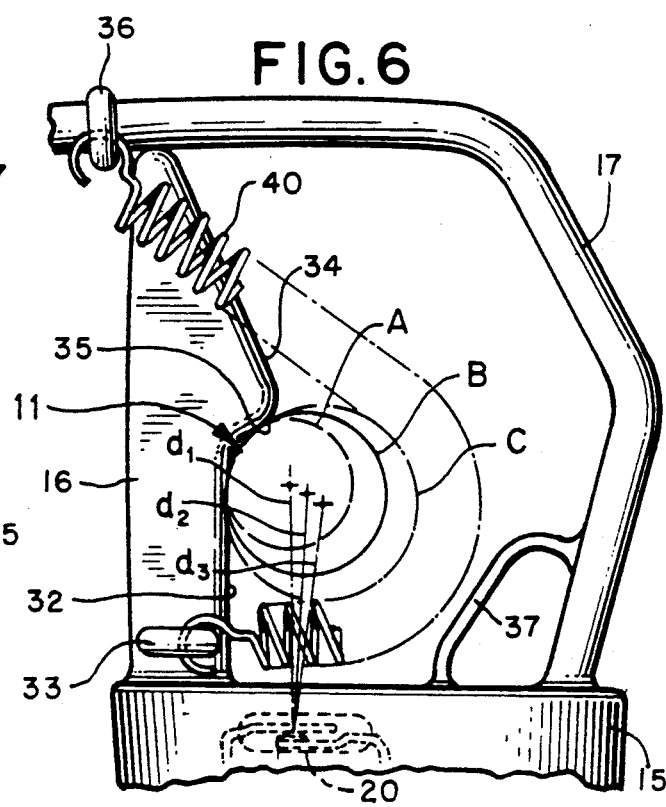

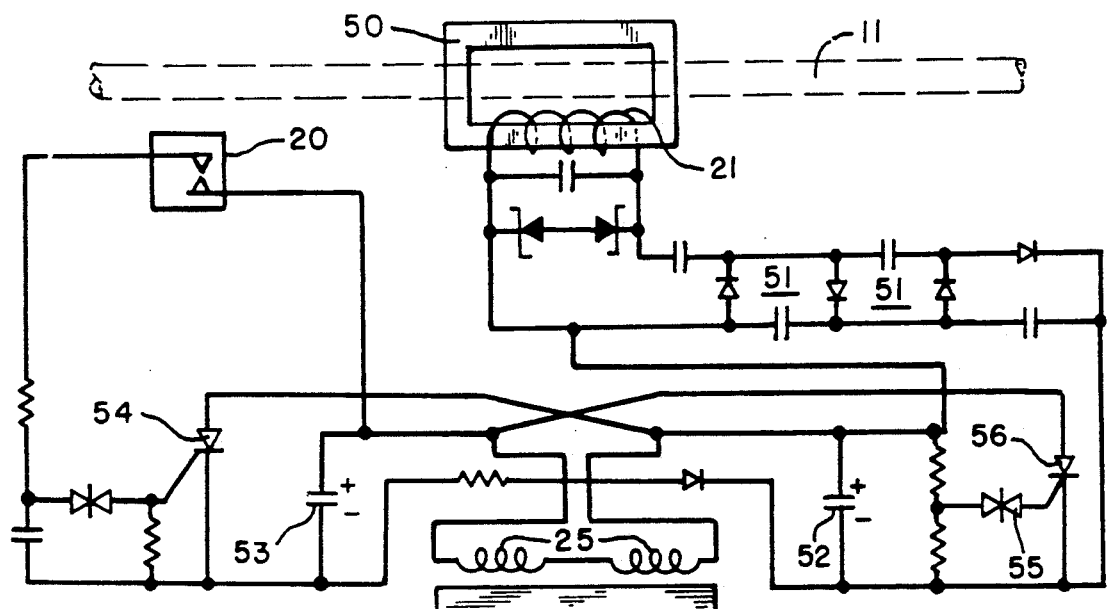
FIG.7
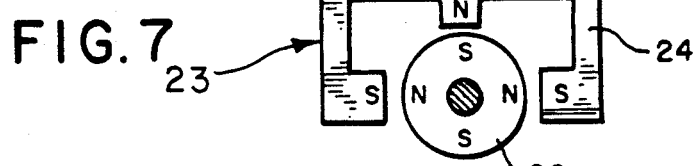
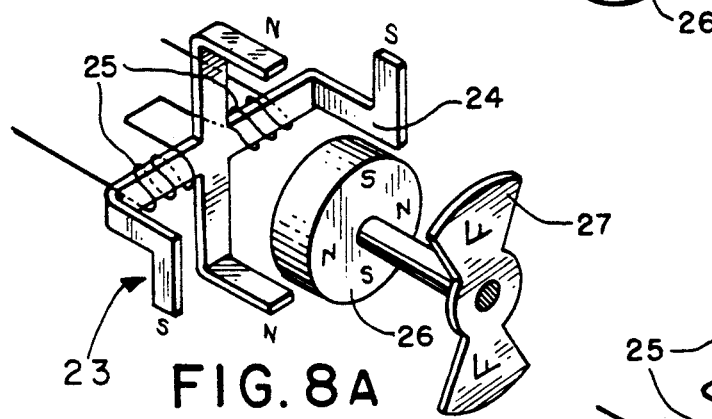
FIG.8A
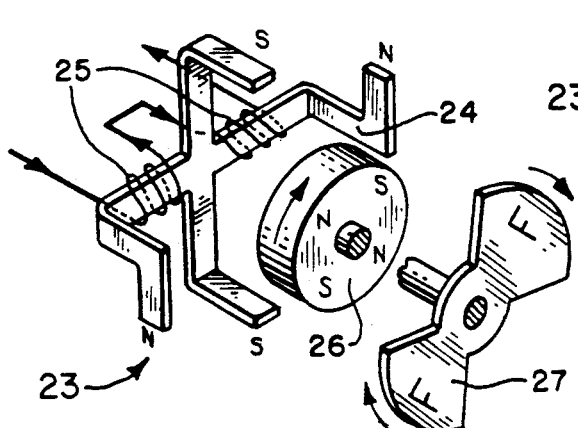
FIG.8B
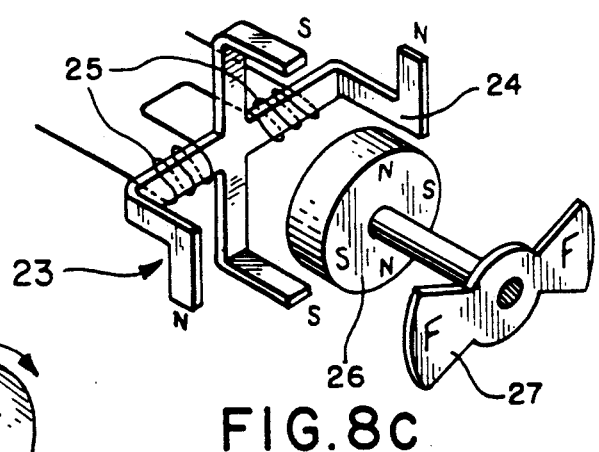
FIG.8C

HOUSING INCLUDING BIASING SPRINGS EXTENDING BETWEEN CLAMP ARMS FOR CABLE MOUNTED POWER LINE MONITORING DEVICE

BACKGROUND OF THE INVENTION

The present invention relates generally to circuit condition monitoring devices for use in electrical power distribution systems, and in particular to a clamp mechanism and housing for mounting such devices to cables of such distribution systems.

Electrical power distribution systems may require the use of a variety of circuit condition monitoring devices to facilitate the detection and location of system malfunctions. Such devices include manually and automatically reset current fault indicators, such as those manufactured by E. O. Schweitzer Manufacturing Co., and described in U.S. Pat. Nos. 4,288,743, 4,086,529 and 3,676,740 of the present inventor, as well as voltage monitoring devices, such as described in U.S. Pat. Nos. 4,251,770, 4,152,643, 4,263,350 and 4,550,288 of the present inventor. The devices may be either of the test point mounted type for mounting on a system test point, or of the clamp-on type, for clamping directly onto a cable of the system.

Clamp-on type devices typically include a housing containing monitoring circuitry, a circuit condition indicator, and some form of clamp mechanism affixed to the housing for mounting the housing on a cable. Frequently, the clamp mechanism serves the additional function of establishing either magnetic or electrostatic communication, or both, between the electrical conductor in the cable and appropriate sensing components of the monitoring apparatus.

Some clamp mechanisms previously known in the art for mounting distribution system monitoring devices typically required the use of both hands as well as a pair of live-line handling tools such as lineman's hotsticks during installation on a system cable. Consequently, such clamp mechanisms were undesirably difficult and time consuming to install.

In other previously known clamp mechanisms the spacing between the conductor and the sensing element varied substantially as a function of cable diameter, causing the calibration of the monitoring device to undesirably vary with cable diameter. Thus, the user was required to calibrate the device for use with a particular diameter cable.

In one prior clamp mechanism, which is described in U.S. Pat. No. 4,456,873 of the present inventor, a plurality of flexible metallic strips are combined to form a generally square-shaped magnetic core for use with a circuit condition monitoring device. One end of the core is affixed to the device housing, and the opposite end is detachably received within an aperture in the housing opposite the first end. In use, the free end of the core is displaced from the device housing, allowing the core to be passed around a cable. The free end is then inserted in the aperture to lock the device to the cable. A similiar core structure is shown in U.S. Pat. No. 3,725,832 of the present inventor.

In another prior clamp mechanism described in U.S. Pat. No. 4,288,743 two insulated metallic members project from the rear surface of the monitoring device. A third spring-biased member normally occupies a position engaging the two projecting members, but can be displaced from the members to allow a cable to be introduced between the two members. The spring-biased member is then allowed to return to its normal position to clamp the device to the cable. In another prior clamp mechanism described in U.S. Pat. No. 4,646,006 two inwardly biased wire clamps are pre-configured to a spaced-apart condition by a spring under compression prior to receiving the cable. The mechanism is maneuvered with a single hotstick so that the cable deforms the pre-configured spring to cause the clamp to engage the cable.

The present invention is directed to a clamping mechanism and housing whereby a monitoring device can be installed on an electrical cable using a single lineman's hotstick and the calibration of the monitoring circuit does not vary appreciably with cable diameter. The one-hand installation contributes to safety, particularly where it is necessary for the lineman to ascend a ladder in order to install the device, or where the monitored cable is closely spaced to other cables and can only be approached from one direction. Moreover, the mechanism and housing of the invention do not have to be pre-configured to an open condition to receive the cable, since the unique geometry of the clamp members allow the cable to be readily engaged at any time with only an applied force.

Accordingly, it is a general object of the present invention to provide a new and improved clamp mechanism and housing for circuit monitoring devices.

It is a more specific object of the present invention to provide a clamp mechanism and housing for installing a circuit condition monitoring device on the cable of a power distribution system which requires the use of only one hand during installation.

It is a further object of the invention to provide a clamp mechanism and housing for a cable-mounted condition monitoring device wherein the calibration of the monitoring device is substantially independent of cable diameter.

It is a still further object of the invention to provide a clamp mechanism and housing which does not require pre-configuration prior to installation on an electrical cable.

SUMMARY OF THE INVENTION

The invention is directed to a housing for mounting a circuit condition monitoring device on and in operating relationship with a monitored electrical cable. The housing comprises a body member adapted to house at least a current-sensing portion of the condition monitoring device, a first clamp arm projecting a finite distance from the body member in a direction generally perpendicular to the axis of the cable, and a second clamp arm having a proximate initial portion projecting from the body member generally parallel-spaced from the first clamp arm, and a distal end portion entending generally perpendicular to and across the end of the first clamp arm. The clamp arms and body member are dimensioned to encircle the cable, the first clamp arm including on its inside surface between an initial proximate portion and a distal end portion cable indexing means for positioning the cable at a predetermined location along the first clamp arm in spaced relationship to the body member. Biasing means extending between the first and second clamp arms urge the cable into engagement with the indexing means.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference nu identify like elements, and in which:

FIG. 1 is a perspective view of a fault indicator utilizing a circuit condition monitoring device housing constructed in accordance with the invention.

FIG. 2 is an enlarged perspective view of the fault indicator partially broken away to show certain principal components thereof.

FIG. 3 is an cross-sectional view of the fault indicator taken along line 3—3 of FIG. 1.

FIG. 4 is a cross-sectional view of the fault indicator taken along line 4—4 of FIG. 3.

FIGS. 5A–5C are a series of simplified elevational views of the fault indicator illustrating the procedure for installing the fault indicator on a cable.

FIG. 6 is an enlarged side elevational view of a portion of the fault indicator illustrating the interface between the fault indicator and the monitored conductor.

FIG. 7 is a simplified schematic diagram of the fault indicator.

FIGS. 8A–8C are a series of Figures illustrating the operation of the electromechanical indicator assembly of the fault indicator.

DESCRIPTION OF THE PREFERRED EMBODIMENT

Referring to the Figures, and particularly to FIG. 1, a circuit condition monitoring device 10 constructed in accordance with the invention is shown installed on an electrical cable 11 of the type commonly utilized in power distribution systems and including a metallic central conductor 12 and a concentric electrically insulating layer 13. The circuit condition monitoring device 10, which in this instance comprises a fault indicator for indicating the occurrence of fault currents within the monitored conductor 12, is contained within a monitor device housing 14 which, in accordance with the invention, comprises a hollow generally cylindrical body member 15, a first relatively non-resilient magnetically permeable clamp arm 16 and a second relatively resilient magnetically permeable clamp arm 17.

Referring to FIG. 2, various sensing and indicating components of the fault indicator are contained within body member 15. In particular, the fault indicator includes a magnetic reed switch 20 aligned at right angles to conductor 12 and a magnetic pickup winding 21 disposed on a connecting portion 22 of clamp arms 16 and 17. The two clamp arms, which are preferably formed by parallel strips of a silicon steel or other material having a high magnetic permeability covered by a layer of electrically insulating rubber or the like, provide, when installed on the conductor as shown in FIG. 1, a magnetic core in magnetic communication with the monitored conductor. Changes in magnetic flux brought about in the magnetic core as a result of current changes in conductor 12 induce a voltage across winding 21 in a manner well known to the art.

Also contained within housing 15 is an electromagnetic indicator assembly 23 comprising a four segment magnetic pole piece 24, indicator actuator windings 25, a four pole actuator magnet 26 and a rotatably mounted indicator flag 27. A circuit board 29 is provided for mounting miscellaneous components of the fault indicator. Indicator flag 27 is visible from the exterior of the housing through a window 30. An eyelet 31 molded into housing 15 facilitates engaging the fault indicator with a conventional lineman's tool.

Referring to FIG. 3, the first clamp arm 16 is seen to comprise a relatively rigid non-flexible member which projects a finite distance from housing 15 in a direction perpendicular to the axis of conductor 12. The initial or proximate portion 16a of this arm has a generally flat inside surface 32 and a pair of oppositely projecting eyelets 33. The distal or end portion 16b of the arm includes a generally flat ramp surface 34 extending to a central notch-like surface 35.

The second clamp arm 17 includes an initial or proximate portion 17a which extends in a generally parallel-spaced relationship to the first clamp arm 16, and a distal end portion 17b which extends generally at right angles to and across the end of clamp arm 16. Clamp arm 17, which is comparatively more resilient and deformable than clamp arm 16, is dimensioned and formed to extend across and in contact with arm 16 so as to form a closed space within which cable 11 is engaged. A pair of outwardly projecting eye hooks 36 are provided on the distal portion 17b at a location beyond the point of contact with clamp arm 16. A rigid stiffener member 37 may be provided to prevent the initial proximate portion 17a from flexing during installation and/or removal of the monitored conductor.

When fault indicator 10 is installed on a conductor the conductor is fixedly positioned against the notch-like surface 35 of the first clamp arm 16 by means of a helical spring 40 which extends from eyelet 33 on arm 16 to eyelet 36 on arm 17. In practice a pair of parallel-spaced helical springs 40 and 41 hold cable 11 tightly into the indexing means provided by the notch-like surface. In addition to holding cable 11 in position, the parallel-spaced helical springs 40 and 41 also serve to bias the second clamp arm 17 against the projecting end of the rigid clamp arm 16. This assists in maintaining the magnetic circuit through the two arms.

Referring to FIGS. 5A–5C, installation and removal of the fault indicator 10 on a monitored cable 11 is greatly facilitated by the unique geometry of clamp arms 16 and 17 and helical springs 40 and 41. In particular, as shown in FIG. 5A, the distal end portion 17b of arm 17 extends a sufficient distance beyond the end of clamp arm 16 such that cable 11 can be readily engaged as the fault indicator 10 is pulled downwardly by, for example, a lineman's tool 42. With continued downward pull the second clamp arm 17 bends upwardly against the bias exerted by helical springs 40 and 41 to provide an opening through which cable 11 can be maneuvered. As shown in FIG. 5B, the opening for cable 11 allows the cable to fit between the end of clamp arm 16 and the inside surface 43 of clamp arm 17. Lineman's tool 42 is maneuvered to one side to achieve this result.

Referring to FIG. 5C, once conductor 11 has been maneuvered through the opening provided by displacement of clamp arm 17 an upward force is exerted on hotstick 42 such that the cable is caused to slide down ramp surface 34 until engaged in indexing surface 35 as shown in FIG. 6. It will be noted that the parallel-spaced springs 40 and 41 assist in guiding cable 11 throughout this process by biasing the cable against the inside surface of clamp arm 16. It should also be noted that the operation is accomplished without additional force other than that exerted by the single hotstick 42, and without the necessity of repositioning fault indicator 10 on the hotstick.

A significant advantage of the circuit monitoring device housing of the present invention is that the effects of variations in cable diameter are minimized. As shown in FIG. 6, for three progressively larger cable diameters A, B and C three almost identical spacings $d_1$, $d_2$ and $d_3$ result between the cable axes and the fault current-responsive magnetic reed switch 20 contained within housing 15. This result is obtained by reason of the cable being indexed to a reference location on the inside surface of clamp arm 16 which is fixedly spaced from housing 15 and the reed switch 20 being positioned generally toward the center of the radii of the circumference formed by the axes of the various cable sizes. Since the distances $d_1$–$d_3$ do not change appreciably with cable size, the magnetic field experienced by reed switch 20 does not change appreciably and the sensitivity of the fault indicator remains substantially constant notwithstanding changes in cable diameter.

It will be appreciated that a further improvement in cable diameter independence can be obtained by repositioning the magnetic reed switch to a location more central to the circumference subscribed by the conductor centers. For example, the reed switch 20 could be positioned further to the left (as viewed in FIG. 6) by providing sufficient room in housing 15.

The circuitry employed in fault indicator 10 may be conventional in construction and operation. As shown in FIG. 7, a magnetic core assembly 50 formed by clamp arms 16 and 17 causes a current to be induced in winding 21 in the presence of an alternating current in conductor 11. This current is rectified by a conventional voltage multiplier rectifier circuit 51 and applied to a reset capacitor 52 and a trip capacitor 53. In the presence of a fault current in conductor 11 magnetic reed contacts 20 momentarily close, causing an SCR 54 to discharge capacitor 53 through windings 25. In the presence of normal current flow the voltage developed across capacitor 52 eventually reaches the breakdown threshold of an avalanche diode 55 and an SCR 56 is caused to conduct and discharge capacitor 52 through windings 25 in the opposite direction.

When windings 25 are actuated with current in one direction upon discharge of capacitor 53 indicator flag 27 is caused to rotate from a reset-indicating position to a trip-indicating position, as shown in FIGS. 8A–8C. Conversely, when actuator windings 25 are actuated with current in a reverse direction upon discharge of capacitor 52 the indicator flag is caused to rotate to the reset-indicating position shown in FIG. 8A.

While the circuit status monitoring device housing 14 of the invention has been shown in connection with a fault indicator device, it will be appreciated that other types of monitoring devices can be accommodated. For example, voltage monitoring can be accomplished, as can applications where remote indications are required. The housing of the invention provides a unique means for installing monitoring circuitry on a monitored conductor without pre-configuration utilizing only a single conventional lineman's tool, while greatly reducing the effects of cable diameter variations on the calibration of the monitoring device.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A housing for mounting a circuit condition monitoring device on and in operative relationship with a monitored electrical cable, comprising:
    a body member adapted to house at least a sensing portion of the condition monitoring device;
    a first clamp arm projecting a finite distance from said body member in a direction generally perpendicular to the axis of the cable;
    a second clamp arm having a initial proximate portion projecting from said body member generally parallel-spaced from said first clamp arm, and a distal end portion entending generally perpendicular to and across the end of said first clamp arm;
    said clamp arms and body member being dimensioned to encircle said cable;
    said first clamp arm including between an initial proximate portion and a distal end portion cable indexing means on the inside surface thereof for positioning the cable along said first clamp arm in spaced relationship to said body member; and
    biasing means extending between said first and second clamp arms for forcing the cable into engagement with said indexing means.

2. A housing for a circuit condition monitoring device as defined in claim 1 wherein said biasing means extend between said proximate portion of said first clamp arm and said distal portion of said second clamp arm.

3. A housing for a circuit condition monitoring device as defined in claim 2 wherein said biasing means comprise a helical spring.

4. A housing for a circuit condition monitoring device as defined in claim 3 wherein said biasing means comprise a pair of parallel-spaced helical springs.

5. A housing for a circuit condition monitoring device as defined in claim 1 wherein indexing means comprise a notch having a ramp surface extending in the direction of said body member.

6. A housing for a circuit condition monitoring device as defined in claim 1 wherein said clamp arms are formed of a magnetically permeable material and magnetically communicate within said body member to form a magnetic pole encircling the conductor.

7. A housing for a circuit condition monitoring device as defined in claim 1 wherein said second clamp arm is generally resilient and deformable, and said first clamp arm is relatively rigid and non-deformable.

8. A housing for mounting a circuit condition monitoring device on and in operative relationship with a monitored electrical cable, comprising:
    a body member adapted to house at least a current-sensing portion of the condition monitoring device;
    a first relatively inflexible clamp arm projecting a finite distance from said body member in a direction generally perpendicular to the axis of the cable;
    a second relatively flexible clamp arm having a initial proximate portion projecting from said body member generally parallel-spaced from said first clamp arm, and a distal end portion entending generally perpendicular to and across the end of said first clamp arm;

said clamp arms and body member being dimensioned to encircle said cable;

said first clamp arm including between an initial proximate portion and a distal end portion cable indexing means on the inside surface thereof for positioning the cable along said first clamp arm in spaced relationship to said body member; and a helical spring extending between said proximate portion of said first clamp arm and said distal portion of said second clamp arm for urging the cable into engagement with said indexing means.

9. A housing for a circuit condition monitoring device as defined in claim 8 wherein said biasing means comprise a pair of parallel-spaced helical springs.

10. A housing for a circuit condition monitoring device as defined in claim 8 wherein indexing means comprise a notch having a ramp surface extending in the direction of said body member.

11. A housing for a circuit condition monitoring device as defined in claim 8 wherein said clamp arms are formed of a magnetically permeable material and magnetically communicate within said body member to form a magnetic pole encircling the conductor.

12. A housing for mounting a circuit condition monitoring device on and in operative relationship with a monitored electrical cable, comprising:

a body member adapted to house at least a current-sensing portion of the condition monitoring device;

a first relatively inflexible clamp arm projecting a finite distance from said body member in a direction generally perpendicular to the axis of the cable;

a second relatively flexible clamp arm having a proximate initial portion projecting from said body member generally parallel-spaced from said first clamp arm, and a distal end portion entending generally perpendicular to and across the end of said first clamp arm;

said first and second clamp arms being formed of a magnetically permeable material and being dimensioned with said body member to encircle the cable to form a magnetic core assembly operable in conjunction with the circuit mounting device;

said first clamp arm including between an initial proximate portion and a distal end portion cable indexing means on the inside surface thereof for positioning the cable along said first clamp arm in spaced relationship to said body member; and a helical spring extending between said proximate portion of said first clamp arm and said distal portion of said second clamp arm for urging the cable into engagement with said indexing means.

13. A housing for a circuit condition monitoring device as defined in claim 12 wherein said biasing means comprise a pair of parallel-spaced helical springs.

14. A housing for a circuit condition monitoring device as defined in claim 12 wherein indexing means comprise a notch having a ramp surface extending in the direction of said body member.

* * * * *